US009097774B2

United States Patent
White et al.

(10) Patent No.: US 9,097,774 B2
(45) Date of Patent: *Aug. 4, 2015

(54) SHORT DETECTION IN BATTERY CELLS

(75) Inventors: David A. White, Houston, TX (US);
Claude L. Benckenstein, Jr., Stafford, TX (US)

(73) Assignee: SOUTHWEST ELECTRONIC ENERGY CORPORATION, Missouri City, TX (US)

( * ) Notice: Subject to any disclaimer, the term of this patent is extended or adjusted under 35 U.S.C. 154(b) by 285 days.

This patent is subject to a terminal disclaimer.

(21) Appl. No.: 13/182,998

(22) Filed: Jul. 14, 2011

(65) Prior Publication Data

US 2013/0018606 A1  Jan. 17, 2013

(51) Int. Cl.
G01R 31/36 (2006.01)
H02J 7/00 (2006.01)
H01M 10/44 (2006.01)
G01R 31/02 (2006.01)

(52) U.S. Cl.
CPC ........ G01R 31/3658 (2013.01); G01R 31/3679 (2013.01); H01M 10/441 (2013.01); H02J 7/0014 (2013.01); G01R 31/025 (2013.01)

(58) Field of Classification Search
CPC ........... G01R 19/165; G01R 19/16538; G01R 19/16542; G01R 19/36; G01R 19/3606; G01R 19/3675; G01R 19/3679; G01R 31/025; G01R 31/3606; G01R 31/3658; G01R 31/3679; H02J 7/0008; H02J 7/0014; H01M 10/441
USPC ...................... 702/58, 63; 320/119
See application file for complete search history.

(56) References Cited

U.S. PATENT DOCUMENTS

| | | | |
|---|---|---|---|
| 5,729,116 A * | 3/1998 | Tsenter | 320/155 |
| 6,420,852 B1 * | 7/2002 | Sato | 320/134 |
| 6,437,539 B2 | 8/2002 | Olsson et al. | |
| 6,680,615 B2 | 1/2004 | Nebon et al. | |
| 7,489,106 B1 | 2/2009 | Tikhonov | |
| 7,683,575 B2 * | 3/2010 | Berdichevsky et al. | 320/122 |
| 7,723,958 B2 | 5/2010 | Darilek | |

(Continued)

FOREIGN PATENT DOCUMENTS

JP    2003173823 A    6/2003

OTHER PUBLICATIONS

Written Opinion and Search Report of PCT/US2012/045948, mailed Oct. 1, 2012.

(Continued)

Primary Examiner — Sujoy Kundu
Assistant Examiner — Liam R Casey
(74) Attorney, Agent, or Firm — Norton Rose Fulbright US LLP

(57) ABSTRACT

Internal shorts and other failures in lithium-ion battery cells may be detected during balancing of the battery cells. A counter may be used to detect when a battery cell is behaving differently than other battery cells by balancing more or less frequently. The counter may increment each time a battery cell is balanced to the other battery cells. A misbehaving battery cell may be flagged, when the counter exceeds a threshold value, for safety checks before an overheating event occurs. This misbehaving battery cell may be faulty due to an internal short. If the faulty battery cell is not corrected by replacement with a different battery cell or corrected by a user resetting the counter, the misbehaving battery cell may be disconnected to prevent the overheating event.

24 Claims, 6 Drawing Sheets

(56) References Cited

U.S. PATENT DOCUMENTS

| | | |
|---|---|---|
| 2003/0085690 A1 | 5/2003 | Shiojima |
| 2008/0278115 A1 | 11/2008 | Huggins |
| 2008/0309286 A1 | 12/2008 | Hoff |
| 2010/0123434 A1* | 5/2010 | Iwata .............................. 320/118 |
| 2011/0068719 A1* | 3/2011 | Oya ............................... 318/139 |
| 2011/0080139 A1 | 4/2011 | Troxel et al. |
| 2011/0089901 A1 | 4/2011 | White et al. |
| 2011/0156649 A1* | 6/2011 | Wu ................................ 320/118 |

OTHER PUBLICATIONS

Written Opinion and Search Report of PCT/US2012/053771.

* cited by examiner

SHORT DETECTION IN BATTERY CELLS

TECHNICAL FIELD

The present disclosure is related to rechargeable batteries. More specifically, the present disclosure is related to fault detection in rechargeable batteries.

BACKGROUND

A device powered by rechargeable batteries may include several battery cells to achieve voltage and/or current levels used by the device. For example, if a rechargeable battery cell has a nominal output voltage of 1 Volt, a device having a 2 Volt operational level may include two battery cells coupled in series. In another example, if a rechargeable battery cell has a nominal output current of 100 milliamps, a device having a 400 milliamp operational level may include four battery cells coupled in parallel. Battery cells coupled in parallel and series may be combined to reach the desired operational voltage and current levels of the device.

The battery cells may be grouped with circuitry for balancing the charge levels in the battery cells to form a battery pack system module. Multiple battery pack system modules may be combined in series or parallel to further increase the output voltage and output current available to a device coupled to the battery pack system modules. Battery cells within a battery pack system module may be balanced by using balancing circuitry within the battery pack system module (referred to as intra-module balancing). Battery pack system modules may also be balanced to other battery pack system modules (referred to as inter-module balancing).

Balancing battery cells is an important process for maintaining the health of and correct operation of a battery system comprising multiple battery pack system modules. The battery system may not behave as desired when battery pack system modules are out of balance with each other or battery cells within a battery pack system module are out of balance with each other. For example, an output voltage from and/or capacity in a battery system with unbalanced battery pack system modules or battery cells may be outside a desired range.

Battery cells and battery pack system modules may experience different wear and use patterns. When battery cells and battery pack system modules experience different wear and use patterns they become more out of balance with other battery cells and battery pack system modules. Battery cells or modules may become out of balance with other cells and modules for a variety of reasons.

One cause may be differences in the age of the cells or modules. For example, when old cells or modules are replaced with new cells or modules, the cells or modules may have different capacities. This results because older cells or modules typically have lower capacity. Capacity of battery cells and modules usually uniformly reduces with age until the cell or module has reached end of life.

Another cause may be difference in the capacity of the cells or modules when they are manufactured. The cells or modules may be manufactured by different suppliers with different material sources and different standards. Thus, each module or cell may have a different capacity and a different capacity decay rate. Even when modules or cells are manufactured by the same supplier, the cells or modules used in a system may not be obtained from the same manufacturing lot of the supplier.

A third cause may be differential temperature of the cells or modules. Self-discharge rate for a cell or module is proportional to the cell's temperature, such that a higher temperature causes a cell or module to self-discharge faster. Cells or modules that experience different temperatures throughout operation may suffer different reductions in capacity. The different temperatures may be the result of proximity to other components in a device Another cause may be differential power drain internal to a module. A battery management system may have component variations or a normal current leakage paths resulting in balancing of a module due to internal power drain of the module.

A fifth cause may be differential physical damage to a cell or module. Physical damage may reduce capacity or create internal shorts.

Another cause may be differential leakage of current internal or external to a cell or cells within a module. Differential leakage may be intermittent or continuous and may or may not cause a detectable amount of heat. Pack manufacturing defects are one cause for external differential leakage current. Cell defects or damage are another cause for external differential leakage current. For example, internal cell shorts may occur as a result of anode dendrites, separator dendrites, manufacture metal flake defects, weld splash defects, cell crush damage, excessive cell vibration, and/or shock. These internal shorts may generate localized heat within the interior of a cell.

Even small intermittent shorts may cause lasting damage to a battery cell. Although small intermittent shorts may burn themselves out, their occurrence may weaken the interior of the cell, which leads to more frequent and more severe internal shorts. Over time, and with stresses of charging and discharging, multiple instances of internal shorts may eventually result in an internal short severe enough to cause a thermal run away event. A thermal run away event is the release of a dangerous amount of energy that may destroy the cell within a very short time. The released energy may damage equipment or injure operators.

One conventional solution for monitoring for internal shorts or failure of the battery cells is a temperature monitor placed on an exterior surface or nearby to each battery cell being monitored. However, internal shorts often occur without causing a detectable temperature increase around the battery cell. Even though the temperature does not immediately rise, a thermal runaway event may nonetheless be building in the battery cell. During a future charge cycle of the battery cells, battery cells coupled to the internally shorted battery cell may overcharge, increasing the likelihood of a thermal runaway event due to the additional stress on the otherwise-healthy battery cells. The combination of the stressed healthy battery cells and the heat from the internally shorted battery cell may result in a thermal runaway event occurring that was originally undetectable by an external temperature sensor.

BRIEF SUMMARY

According to one embodiment, a method includes monitoring a plurality of battery cells. The method also includes counting a number of times at least one battery cell of the plurality of battery cells is out of balance with other battery cells of the plurality of battery cells. The method further includes marking the at least one battery cell as faulty based, in part, on the counted number of times.

According to another embodiment, a computer program product includes a non-transitory computer-readable medium having code to monitor a plurality of battery cells. The medium also includes code to count a number of times at least one battery cell of the plurality of battery cells is out of balance with other battery cells of the plurality of battery cells. The medium further includes code to mark the at least one battery cell as faulty based, in part, on the counted number of times.

According to a further embodiment, an apparatus includes a plurality of battery cells and a microprocessor coupled to the plurality of battery cells. The microprocessor is configured to monitor a plurality of battery cells. The microprocessor is further configured to count a number of times at least one battery cell of the plurality of battery cells is out of balance with other battery cells of the plurality of battery cells. The microprocessor is also configured to mark the at least one battery cell as faulty based, in part, on the counted number of times.

The foregoing has outlined rather broadly the features and technical advantages of the present disclosure in order that the detailed description of the disclosure that follows may be better understood. Additional features and advantages of the disclosure will be described hereinafter that form the subject of the claims of the disclosure. It should be appreciated by those skilled in the art that the conception and specific embodiment disclosed may be readily utilized as a basis for modifying or designing other structures for carrying out the same purposes of the present disclosure. It should also be realized by those skilled in the art that such equivalent constructions do not depart from the spirit and scope of the disclosure as set forth in the appended claims. The novel features that are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following descriptions taken in conjunction with the accompanying drawing.

DETAILED DESCRIPTION

Although an external temperature monitor may be insufficient to detect a thermal run away event before it occurs, other methods may be used to detect internal shorts in battery cells or modules. A battery cell with internal shorts may be balanced more frequently or less frequently than other battery cells. For example, when an internal cell short causes a current drain the battery cell discharges faster causing the balancing circuits to direct differential current to respond to the shorted battery cell. A balancing circuit or an external monitor to the balancing circuit, may track the number of times a battery cell is balanced and determine that a battery cell has an internal short before a thermal run away event occurs. The circuit or monitor may determine the battery cell is being excessively balanced by implementing threshold detection such as when a count exceeds a threshold, implementing an algorithm to detect unusual balancing behavior over time, and/or implementing a differential test to determine when the balancing of one cell exceeds an expected number of balancing operations based, in part, on other battery cells being balanced. In one example, a time and a quantity are recorded each time a battery cell is balanced with other battery cells to record how frequently and how much a battery cell is charged or discharged to reach balance with other battery cells.

Figure 1:
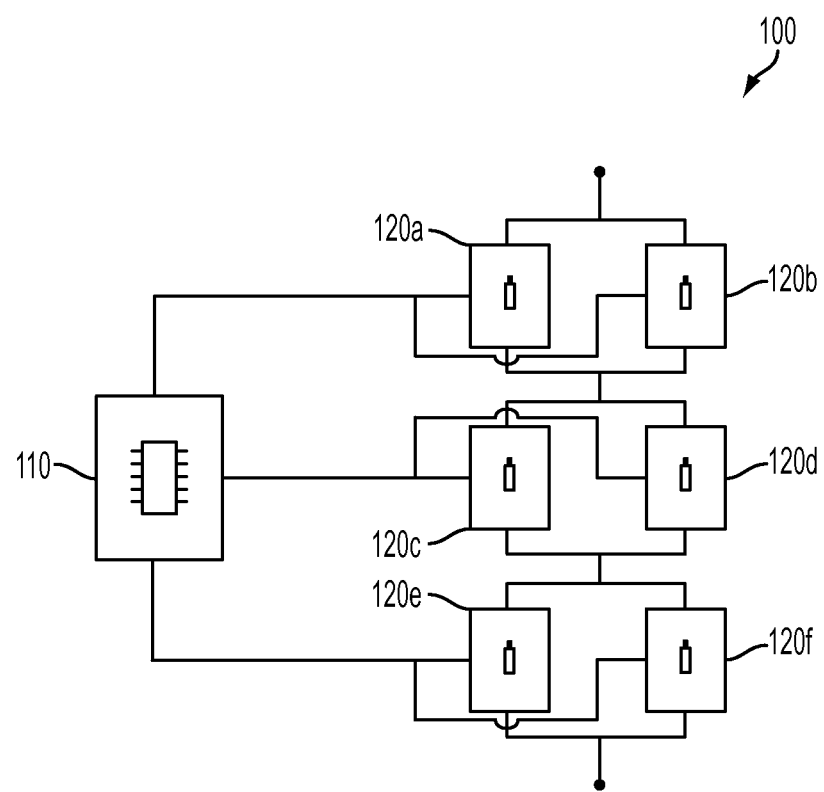
FIG. 1 is a block diagram illustrating a microprocessor balancing a plurality of battery cells according to one embodiment of the disclosure.

FIG. 1 is a block diagram illustrating a microprocessor balancing a plurality of battery cells according to one embodiment of the disclosure. A microprocessor 110 of a battery system 100 may be coupled to communicate with battery cells 120. The battery cells 120 may be, for example, lithium-ion battery cells. The microprocessor 110 may be a general purpose central processing unit ("CPU") or microprocessor, graphics processing unit ("GPU"), microcontroller, or the like. The present embodiments are not restricted by the architecture of the microprocessor 110 so long as the microprocessor 110, whether directly or indirectly, supports the modules and operations as described herein. The microprocessor 110 may execute various logical instructions, as described below and in FIG. 2 and FIG. 3, according to the present embodiments.

According to one embodiment, the microprocessor 110 may communicate directly with circuitry inside the battery cells 120. According to another embodiment, the microprocessor 110 may receive information about the battery cells 120 by measuring the battery cells 120 through external circuitry (not shown), such as a current measurement resistor and/or a voltmeter. The battery cells 120 may be coupled in series and/or in parallel with each other to obtain a desired output current and/or voltage. For example, the battery cells 120 may include battery cells 120a and 120b coupled in parallel to provide an output current twice the output current of either the battery cell 120a or the battery cell 120b individually. In another example, the battery cells 120a and 120b may be coupled in series with the parallel connection of battery cells 120c and 120d and the parallel connection of battery cells 120e and 120f to increase an output voltage of the battery system 100 to three times the output voltage of any of the parallel-coupled battery cells 120a-b, 120c-d, or 120e-f individually.

The battery system 100 may also include charging circuitry and balancing circuitry (not shown) for charging and balancing the battery cells 120a-e. Examples of balancing circuitry are described in U.S. Pat. No. 7,880,434 to White et al., filed on Apr. 2, 2009, and entitled "System for Balancing a Plurality of Battery Pack System Modules Connected in Series" and are described in U.S. patent application Ser. No. 12/899,413 to White et al., filed on Oct. 6, 2010, and entitled "Module bypass switch for balancing battery pack system modules," both of which are hereby incorporated by reference. According to one embodiment, the battery system 100 may be part of a battery pack system module and connected in series or parallel with other battery pack system modules. When the battery system 100 is part of a battery pack system module, the battery system 100 may be balanced through inter-module balancing to obtain balance with other battery pack system modules. The battery cells 120 may also be balanced through intra-module balancing to obtain balance between the battery cells 120.

Figure 2:
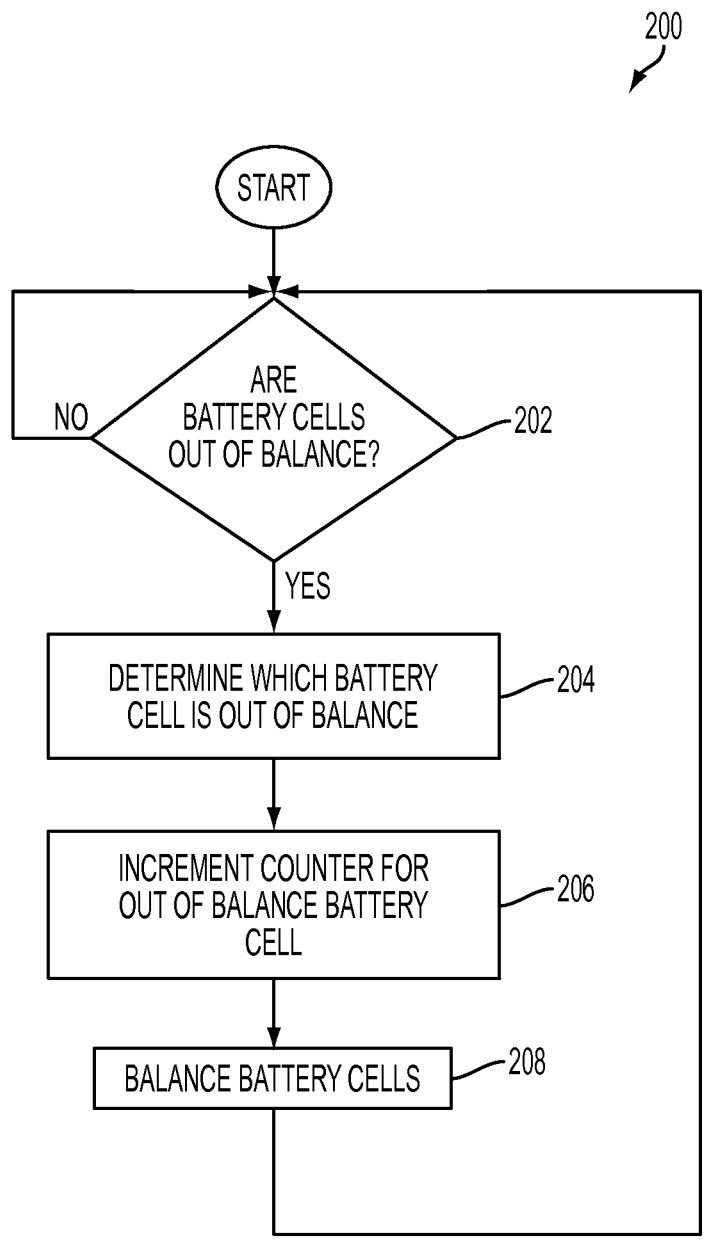
FIG. 2 is a flow chart illustrating a method of balancing a plurality of battery cells according to one embodiment of the disclosure.

The microprocessor 110 may be programmed to monitor and/or direct the balancing of the battery cells 120. FIG. 2 is a flow chart illustrating a method of balancing a plurality of battery cells according to one embodiment of the disclosure. A method 200 begins at block 202 with determining if any of the battery cells 120 are out of balance. If none of the battery cells 120 is out of balance then the method 200 remains at block 202. When one of the battery cells 120 is out of balance, the method 200 proceeds to block 204 with determining which battery cell of the cells 120 is out of balance. At block 206 a counter corresponding to the out-of-balance battery cell is incremented. For example, the microprocessor 110 may store counters for the battery cells 120a-b, 120c-d, and 120e-f in registers inside the microprocessor 110 or in memory (not shown) coupled to the microprocessor 110, which may be PROM, EPROM, EEPROM, optical storage, or the like. If the battery cell 120a is determined to be out of balance at block 204 then a counter for the battery cell 120a is incremented at block 206. Although not shown, isolation diodes may be coupled to the battery cells 120a and 120b, allowing the battery cells 120a and 120b to be charged and/or discharged separately. At block 208 the battery cells are balanced. In the above example, current may be redirected to the battery cell 120a if the battery cell 120a is determined to be out of balance with other battery cells and at a lower state of charge than the other battery cells. Alternatively, in the above example, other battery cells may be discharged to reach balance with the battery cell 120a. After the other battery cells have been discharged to reach balance, all of the battery cells may be charged to full capacity.

Although the example above describes determining a single battery cell is out of balance at block 204, the microprocessor 110 may determine multiple battery cells are out of balance. For example, the microprocessor 110 may determine that the battery cells 120a and 120c are out of balance with other battery cells. Then, at block 206, the microprocessor 110 may increment counters corresponding to the battery cells 120a and 120c, and balance the battery cells 120a and 120c with the other cells at block 208.

According to one embodiment, the microprocessor 110 may determine when one of the battery cells 120 is out of balance with other battery cells by counting Coulombs charged and discharged through the battery cells 120. Additional details for Coulomb counting may be found in U.S. Pat. No. 7,917,315 to Benckenstein et al., filed on Aug. 13, 2008, and entitled "Method for determining power supply usage," which is hereby incorporated by reference. According to another embodiment, the microprocessor 110 may determine when one of the battery cells 120 is out of balance by measuring a voltage across terminals of each of the battery cells 120.

Figure 3:
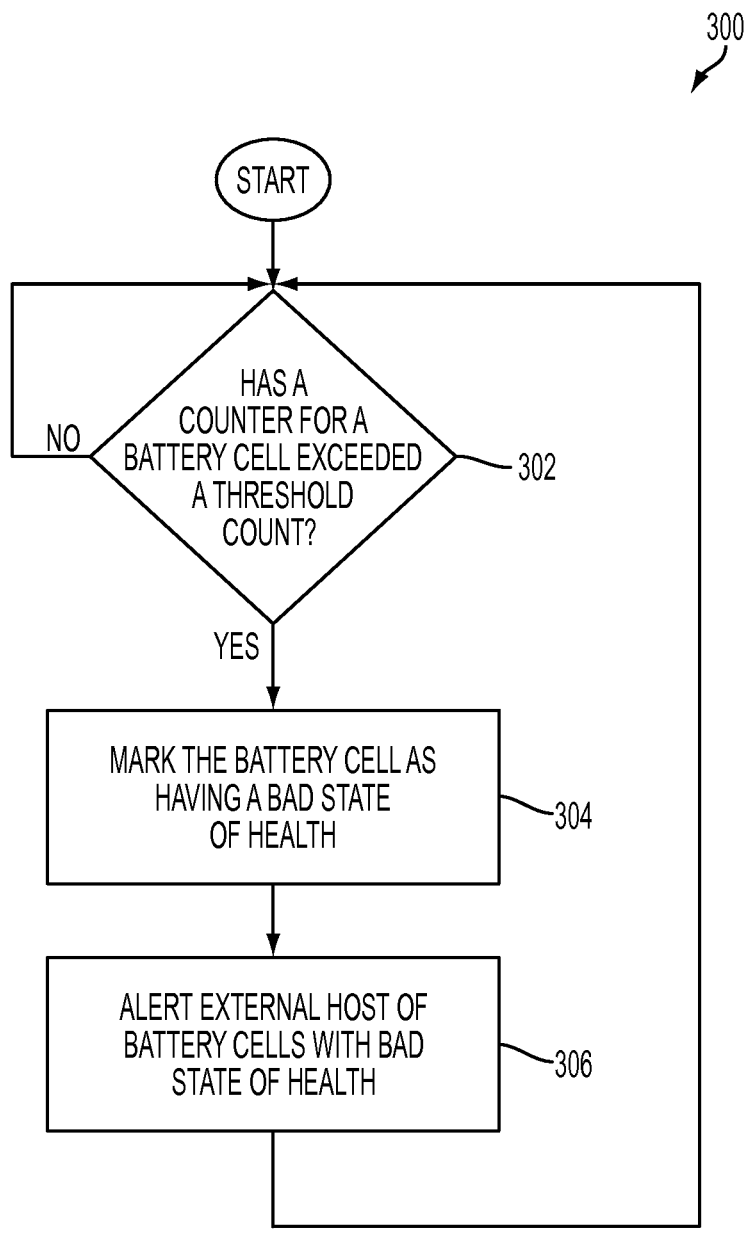
FIG. 3 is a flow chart illustrating a method of determining when a battery cell is faulty according to one embodiment of the disclosure.

When the microprocessor 110 has information regarding the number of times each of the battery cells 120 of a battery system 100 has been out of balance, the microprocessor 110 may determine a state of health, such as whether the battery cell is faulty or has a warning, for each of the battery cells 120. FIG. 3 is a flow chart illustrating a method of determining when a battery cell is faulty according to one embodiment of the disclosure. A method 300 begins at block 302 with the microprocessor 110 determining whether a counter for one of the battery cells 120 has exceeded a threshold count. If none of the battery cells 120 has exceeded the threshold number of balancing operations, the method 300 remains at block 302.

When one or more of the battery cells 120 exceeds the threshold count, the method 300 continues to block 304 to mark the battery cell exceeding the threshold number of balancing operations as having a fault. The threshold level of the microprocessor 110 may be adjusted to determine how early a battery cell is marked as having a fault. For example, a threshold level may be set lower to detect faults within the battery cell earlier. According to one embodiment, each of the battery cells 120 may have different threshold levels configurable by a user operating the microprocessor 110. For example, a user may configure the microprocessor 110 with information regarding a make, model, and/or type for each of the battery cells 120 and each make, model, or type may have a different threshold count for determining when the battery cell has reached a faulty state.

At block 306 the microprocessor 110 may alert an external host of battery cells with determined or possible faults. According to one embodiment, the microprocessor 110 may activate a light emitting diode (LED) on a control panel (not shown) indicating to a user that one of the battery cells 120 corresponding to the LED is faulty. In another embodiment, the microprocessor 110 may generate an electronic notification for a user regarding the fault conditions of the battery cells 120. For example, the microprocessor 110 may transmit an electronic mail message or text message to an administrator notifying the administrator when one of the battery cells 120 has reached a faulty state. In another example, the microprocessor 110 may transmit an electronic mail message or text message at periodic intervals, such as hourly, daily, or weekly, with information regarding the state of health of each of the battery cells 120. After block 306 the microprocessor 110 may return to waiting for a battery cell to exceed a threshold count.

According to one embodiment, one or more bits in a register may be assigned as state-of-health alert bits. Each of the bits may correspond to a battery cell or battery pack system module. When a battery cell or battery pack system module is determined to be in a bad state-of-health, the corresponding bit in the register may be set. The microprocessor 110 may then poll the bits to determine when one of the battery cells or battery pack system modules becomes faulty. The polling may be communicated through a MODBUS or RS-485 protocol. When a communications bus capable of posting an alert, such as a CAN bus, is implemented, the state-of-health information may be directly posted on the communications bus without being polled.

Multiple threshold levels may be set for each of the battery cells 120. For example, a first threshold level may be set to indicate a "warning" level for a battery cell, and a second threshold level may be set to indicate a "fault" level for a battery cell. Thus, a user may be notified that a battery cell should be inspected at the next opportunity when the "warning" level is reached. If no action is taken by the user and the number of balancing cycles for a battery cell reaches the second threshold, the user may be notified of the "fault" and the microprocessor 110 may automatically disconnect the faulty battery cell or the entire battery system 100 until a user acknowledges the fault or resets the battery system 100.

In another embodiment, the balance counting method described above in FIG. 2 and FIG. 3 may be combined with other fault detection methods. For example, a battery cell may be marked with a "warning" when the battery cell has reached a threshold number of battery cell balancing operations. Then, if a temperature sensor detects an increase in temperature of the same battery cell, the battery cell may be marked with a "fault."

In yet another embodiment, the threshold count for determining when one of the battery cells 120 is faulty may be specified as a differential value compared to the other battery cells. For example, the battery cell may be determined to have exceeded the threshold count and marked as faulty when one of the battery cells 120 is out-of-balance twice as many times as one of the other battery cells.

In another embodiment, the threshold count for determining when one of the battery cells 120 is faulty may be based on a detection algorithm. For example, an algorithm may examine the battery cells 120 for behavioral patterns and compare balancing operations of the battery cells 120 to patterns known to result from internal shorts. In another example, an algorithm may examine the battery cells 120 for a certain number of balancing operations within a certain period of time.

One cause for one of the battery cells 120 to exceed the threshold count for number of balancing operations may be that the battery cell has an internal short. An internal short in one of the battery cells 120 may cause reduced capacity of the battery cell, slower charge rate for the battery cell, and/or faster discharge rate for the battery cell. Internal shorts in battery cells may lead to thermal runaway events resulting in a fire, or worse, an explosion. The possibility of fire and explosion resulting from an internal short creates a safety hazard for the operator of equipment powered by the battery cells. When one of the battery cells 120 develops an internal short, the battery cell may exhibit one of the above symptoms resulting in more frequent balancing of the battery cell with the internal short than other battery cells. Thus, monitoring the number of balancing cycles each of the battery cells 120 completes may provide information about an internal short located in the battery cell or another malfunction within the battery cell.

Figure 4:
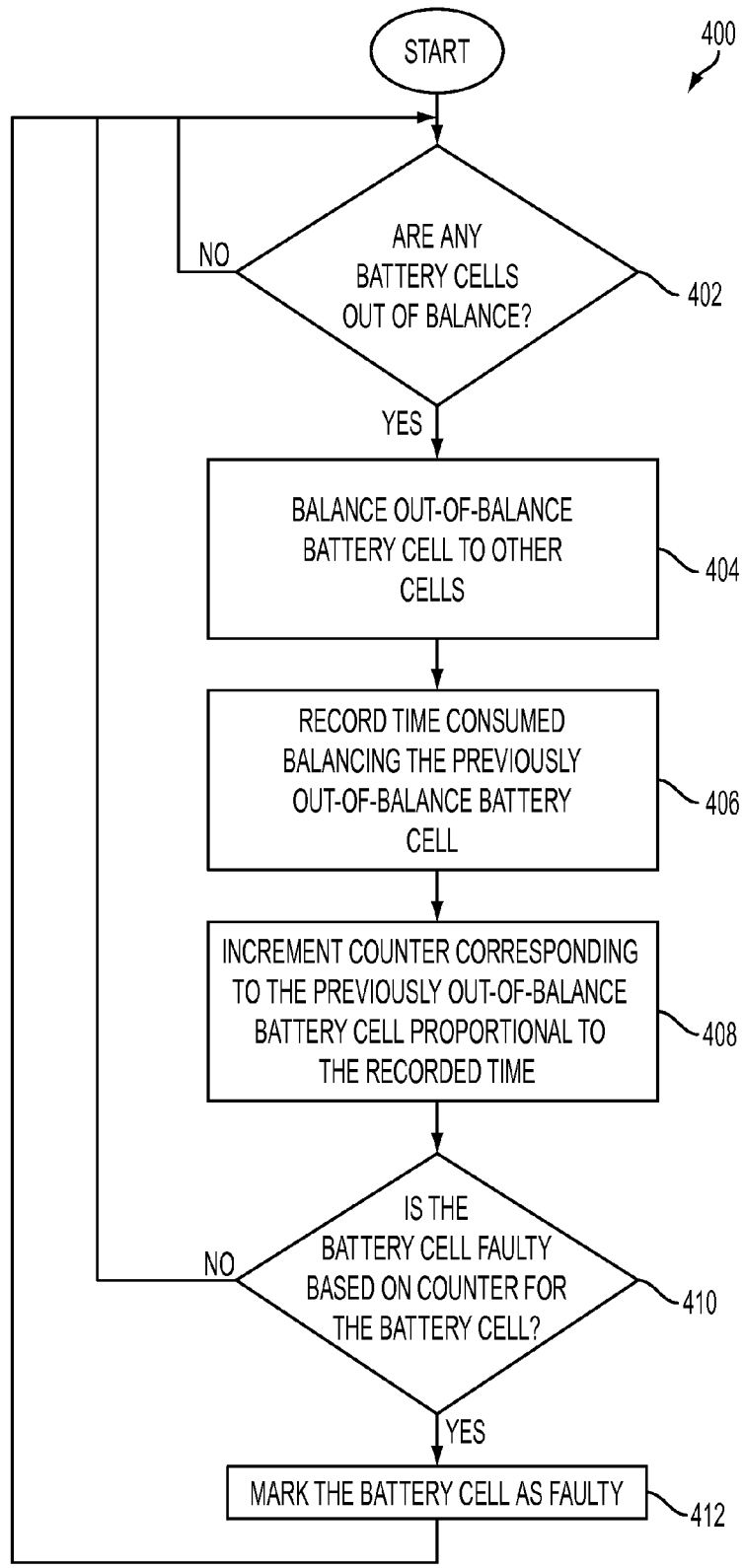
FIG. 4 is a flow chart illustrating a method of determining when a battery cell is faulty based on time consumed balancing an out-of-balance battery cell according to one embodiment of the disclosure.

Although the example above describes an integer counter counting the number of times a battery cell is balanced to other battery cells, the counter may also be, for example, an accumulator. According to one embodiment, the accumulator may be incremented based, in part, on an integrated value of the amount of charge or current used to bring the out-of-balance battery cell into balance with the other battery cells. According to another embodiment, the accumulator may be incremented based, in part, on time spent balancing the out-of-balance battery cell with other battery cells. FIG. 4 is a flow chart illustrating a method of determining when a battery cell is faulty based on time consumed balancing an out-of-balance battery cell according to one embodiment of the disclosure.

A method 400 begins at block 402 with determining if any of the battery cells 120 are out-of-balance with other battery cells. At block 404 the out-of-balance battery cell is balanced to other battery cells. The out-of-balance battery cell may be at a lower state of charge than other battery cells. When at a lower state of charge, the out-of-balance battery cell may be charged faster than other battery cells until all battery cells are at a substantially similar state of charge. Alternatively, the other battery cells may be discharged faster until all battery cells are at a substantially similar state of charge.

The out-of-balance battery cell may also be at a higher state of charge than other battery cells, in which case the out-of-balance battery cell may be discharged to reach balance or the other battery cells may be charged to reach balance. According to one embodiment, balancing when the battery cell is at a higher state of charge is not added to the battery cell's counter because, when a battery cell is out-of-balance at a higher state of charge, the out-of-balance condition may not be caused by an internal short. However, the counters for the other battery cells may be incremented, because the other battery cells are considered to be out-of-balance with the battery cell at a higher state of charge. One battery cell at a higher state of charge than other battery cells may result when the one battery cell has a higher capacity than other battery cells and/or if the one battery cell is at a lower temperature than other battery cells such that the one battery cell does not self-discharge as rapidly as other battery cells. These possibilities may be taken into account by the microprocessor 110 when determining whether to increment the counter for any battery cell.

At block 406 the time consumed balancing the previously out-of-balance battery cell is recorded. The time recorded may be either the time spent charging the previously out-of-balance battery cell or the time spent discharging the other battery cells or both. At block 408 a counter corresponding to the out-of-balance battery cell is increased proportionally to the time recorded at block 406.

At block 410 it is determined whether the previously out-of-balance battery cell is faulty based on its corresponding counter. The determination whether a battery cell is faulty may be based, in part, on the counter corresponding to the battery cell. For example, the battery cell may be determined as faulty when the counter exceeds a threshold count, such as a maximum total amount of time consumed balancing. In another example, the battery cell may be determined as faulty based, in part, on a history of the counter. That is, the history of the counter, such as when and how much the counter has been incremented, may be compared to historical profiles of known faulty battery cells to determine if the counter's history is similar to a known historical profile. According to one embodiment, a correlation score is calculated between the known historical profile and the counter's history. When the correlation score exceeds a threshold value, the battery cell may be marked as faulty. At block 410, only the previously out-of-balance battery pack's counter may be examined or each of the battery pack's counters may be examined to determine if any of the battery cells is faulty.

Figure 5:
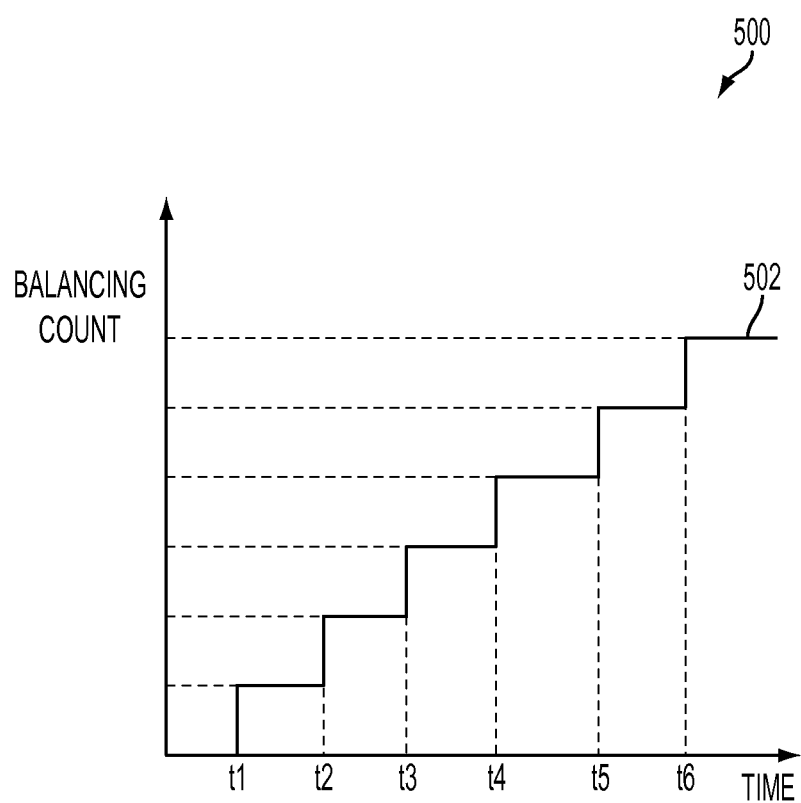
FIG. 5 is a graph illustrating a balancing count history of a possibly faulty battery cell according to one embodiment of the disclosure.

FIG. 5 is a graph illustrating a balancing count history of a possibly faulty battery cell according to one embodiment of the disclosure. A line 502 of a graph 500 illustrates a historical profile of a known faulty battery cell. At each time increment, $t_i$, the battery cell is determined to be out-of-balance, the battery cell is balanced, and the counter incremented. The battery cell is frequently out-of-balance based on the stair-step pattern of the line 502.

Figure 6:
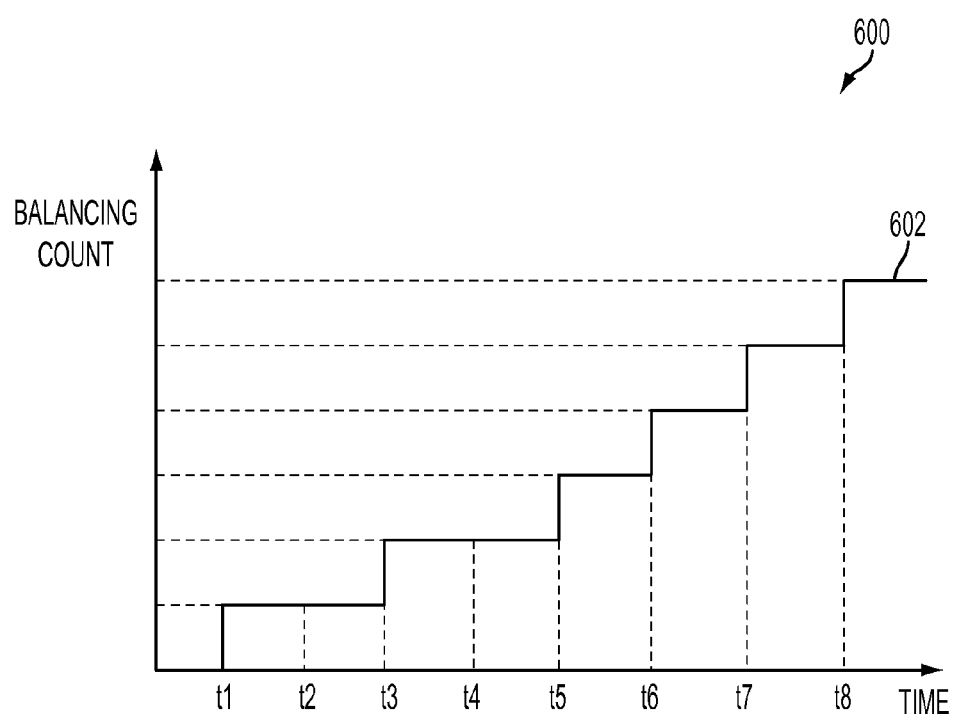
FIG. 6 is a graph illustrating a measured count of a battery cell according to one embodiment.

FIG. 6 is a graph illustrating a measured count of a battery cell according to one embodiment. A line 602 of a graph 600 may be measured for a battery cell and compared to the graph of FIG. 5 to determine if the battery cell is faulty. At times $t_1$, $t_2$, $t_3$, $t_4$, and $t_5$ the correlation between the measured profile and the historical profile of FIG. 5 may not be high enough to trigger an alert that the battery cell is faulty. That is, the counter represented by the line 602 is not increasing as quickly as the counter illustrated by the line 502 of FIG. 5. However, between times $t_5$ and $t_8$ the rate of balancing of the battery cell increases and exhibits a stair-step pattern similar to that of FIG. 5. Thus, the battery cell may be determined as faulty at any time between $t_5$ and $t_8$, based, in part, upon a sensitivity factor in the correlation score calculation. The sensitivity factor and the correlation score calculation may be configured in the microprocessor 110. According to one embodiment, the correlation score calculation may be unique for each of the battery cells and may be based, in part, on a formula corresponding to a make and model of each battery cell. According to another embodiment, the sensitivity factor is also based, in part, upon the make and model of each battery cell.

Referring back to FIG. 4, if a battery cell is determined as faulty as block 410, the battery cell is marked as faulty at block 412. When the battery cell is marked as faulty, the battery cell may be disconnected or an administrator may be notified of the fault. After the battery cell is marked as faulty the method 400 returns to block 402. If no battery cell is determined to be faulty at block 410 the method 400 returns to block 402.

Monitoring the number of balancing cycles each of the battery cells 120 completes is a more reliable method for determining when a possible safety hazard exists in one of the battery cells 120. If only a temperature of the battery cells 120 is monitored a thermal runaway event may already be in progress before a temperature sensor external to the battery cells 120 detects an increase in temperature. Instead, by counting the number of balancing cycles completed for each of the battery cells 120 an internal short may be detected before any increase in temperature due to a thermal runaway event occurs. Thus, the faulty battery cell may be removed, replaced, and/or disabled before additional problems, such as a fire or explosion, occur. Although internal short faults are discussed, the method described above may be used for identifying other faults such as leaking electrolyte.

Although counting is described above for intra-module balancing of battery cells within a battery pack system module, the method may also be applied to counting balancing of battery pack system modules. When one battery pack system module is frequently balanced in comparison to other battery pack system modules, the battery pack system module may be marked as faulty and replaced by a user with a new battery pack system module.

If implemented in firmware and/or software, the functions described above with reference to FIG. 2 and FIG. 3 may be stored as one or more instructions or code on a computer-readable medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer. Disk and disc, as used herein, include compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method, comprising:
monitoring, by a microprocessor, a plurality of battery cells through circuitry coupled to the plurality of battery cells to monitor at least one of a voltage across at least one of the plurality of battery cells and a current through at least one of the plurality of battery cells;
counting, by the microprocessor, a first number of times a first battery cell of the plurality of battery cells is out of balance with other battery cells of the plurality of battery cells, wherein the step of counting comprises determining whether the first battery cell is out of balance with the other battery cells by comparing a relative state of charge of the first battery cell with a relative state of charge of at least one of the other battery cells, wherein the relative state of charge of the first battery cell and the at least one of the other battery cells is determined based, at least in part, on the step of monitoring the plurality of battery cells;
counting, by the microprocessor, a second number of times a second battery cell of the plurality of battery cells is out of balance with other battery cells of the plurality of battery cells, wherein the step of counting comprises determining whether the second battery cell is out of balance with the other battery cells by comparing a relative state of charge of the second battery cell with a state of charge of at least one of the other battery cells; and
marking, by the microprocessor, the first battery cell as potentially faulty due to an internal short based, at least in part, on the first count exceeding a first threshold,
wherein the first threshold, for marking the first battery cell as potentially faulty due to an internal short is based at least in part on the second count.

2. The method of claim 1, further comprising:
storing a time associated with the first count when the first battery cell is out of balance with the other battery cells, the time indicating when the first battery cell is out of balance with the other battery cells; and
storing a quantity associated with the first count when the first battery cell is out of balance with the other battery cells, the quantity indicating a charge difference between the first battery cell and the other battery cells, in which marking the first battery cell as potentially faulty is also based, at least in part, on the time and quantity of each counted time the first battery cell is out of balance with the other battery cells.

3. The method of claim 2, in which marking the first battery cell as potentially faulty comprises comparing the first counted number of times, quantity information, and time information with at least one known historical profile of a potentially faulty battery cell.

4. The method of claim 1, in which the step of monitoring the plurality of battery cells comprises monitoring battery cells in a plurality of battery pack system modules, and the method further comprises replacing at least one battery pack system module of the plurality of battery pack system modules containing the at least one battery cell marked as potentially faulty.

5. The method of claim 1, further comprising:
transmitting a message to a user that the first battery cell is potentially faulty; and
disconnecting the first battery cell after marking the first battery cell.

6. A computer program product, comprising: a non-transitory computer-readable medium comprising:
code to instruct a microprocessor to monitor, through circuitry coupled to a plurality of battery cells, at least one of a voltage across at least one of the plurality of battery cells and a current through at least one of the plurality of battery cells;
code to count a first number of times a first battery cell of the plurality of battery cells is out of balance with other battery cells of the plurality of battery cells, wherein the code to count the first number of times comprises code to determine whether the first battery cell is out of balance with the other battery cells by comparing a relative state of charge of the first battery cell with a relative state of charge of at least one of the other battery cells, wherein the state of charge of the first battery cell and the at least one of the other battery cells is based, at least in part, on the at least one of a voltage across at least one of a plurality of battery cells and a current through at least one of the plurality of battery cells;
code to count a second number of times a second battery cell of the plurality of battery cells is out of balance with other battery cells of the plurality of battery cells, wherein the code to count comprises code to determine whether the second battery cell is out of balance with the other battery cells by comparing a relative state of charge of the second battery cell with a relative state of charge of at least one of the other battery cells; and
code to mark the first battery cell as potentially faulty due to an internal short based, at least in part, on the first count exceeding a first threshold,
wherein the first threshold, for marking the first battery cell as potentially faulty due to an internal short is based at least in part on the second count.

7. The computer program product of claim 6, in which the medium further comprises:
code to store a time associated with the first count when the first battery cell is out of balance with the other battery cells, the time indicating when the first battery cell is out of balance with the other battery cells; and
code to store a quantity associated with the first count when the first battery cell is out of balance with the other battery cells, the quantity indicating a charge difference between the first battery cell and the other battery cells, in which marking the first battery cell as potentially faulty is also based, at least in part, on the time and quantity of each counted time the first battery cell is out of balance with the other battery cells.

8. The computer program product of claim 7, in which the medium further comprises code to compare the first counted number of times, quantity information, and time information with at least one known historical profile of a potentially faulty battery cell.

9. The computer program product of claim 6, in which the medium further comprises:
code to disconnect the first battery cell after marking the first battery cell; and
code to transmit a message to a user that the first battery cell is potentially faulty.

10. An apparatus, comprising:
a plurality of battery cells;
circuitry coupled to the plurality of battery cells configured to measure at least one of a current through at least one of the plurality of battery cells and a voltage across at least one of the plurality of battery cells; and
a microprocessor coupled to the plurality of battery cells through the circuitry, in which the microprocessor is configured:
to monitor at least one of a voltage across at least one of the plurality of battery cells and a current through at least one of the plurality of battery cells;
to count a first number of times a first battery cell of the plurality of battery cells is out of balance with other battery cells of the plurality of battery cells, wherein the microprocessor is configured to determine whether the first battery cell is out of balance with the other battery cells by comparing a relative state of charge of the first battery cell with a relative state of charge of at least one of the other battery cells, wherein the microprocessor is configured to determine a relative state of charge of the first battery cell and the at least one of the other battery cells based, at least in part, on the monitored at least one of a voltage across at least one of the plurality of battery cells and a current through at least one of the plurality of battery cells;
to count a second number of times a second battery cell of the plurality of battery cells is out of balance with other battery cells of the plurality of battery cells, wherein the microprocessor is further configured to determine whether the second battery cell is out of balance with the other battery cells by comparing a relative state of charge of the second battery cell with a relative state of charge of at least one of the other battery cells; and
to mark the first battery cell as potentially faulty due to an internal short based, at least in part, on the first count exceeding a first threshold,
wherein the first threshold, for marking the first battery cell as potentially faulty due to an internal short is based at least in part on the second count.

11. The apparatus of claim 10, in which the microprocessor is further configured:
to store a time associated with the first count when the first battery cell is out of balance with the other battery cells, the time indicating when the first battery cell is out of balance with the other battery cells; and
to store a quantity associated with the first count when the first battery cell is out of balance with the other battery cells, the quantity indicating a charge difference between the first battery cell and the other battery cells, in which marking the first battery cell as potentially faulty is also based, at least in part, on the time and quantity of each counted time the first battery cell is out of balance with the other battery cells.

12. The apparatus of claim 11, in which marking the first battery cell as potentially faulty comprises comparing the first counted number of times, quantity information, and time information with at least one known historical profile of a potentially faulty battery cell.

13. The apparatus of claim 10, in which the microprocessor is further configured to transmit a message to a user that the first battery cell is potentially faulty.

14. The apparatus of claim 10, in which the microprocessor is further configured to disconnect the first battery cell marked as potentially faulty.

15. The apparatus of claim 10, in which the plurality of battery cells and the microprocessor comprises a battery pack system module.

16. The method of claim 1, further comprising:
   monitoring a temperature of the first battery cell marked as potentially faulty; and
   when the temperature of the first battery cell increases, marking the first battery cell as faulty.

17. The computer program product of claim 6, further comprising:
   code to monitor a temperature of the first battery cell marked as potentially faulty; and
   code to mark the first battery cell as faulty when the temperature of the first battery cell increases.

18. The apparatus of claim 10, in which the microprocessor is further configured:
   to monitor a temperature of the first battery cell marked as potentially faulty; and
   to mark the first battery cell as faulty when the temperature of the first battery cell increases.

19. The method of claim 1, wherein the step of comparing a relative state of charge of the first battery cell with a relative state of charge of at least one of the other battery cells comprises comparing a voltage at terminals of the first battery cell with a voltage at terminals of at least one of the other battery cells.

20. The computer program product of claim 6, wherein the step of comparing a relative state of charge of the first battery cell with a relative state of charge of at least one of the other battery cells comprises comparing a voltage at terminals of the first battery cell with a voltage at terminals of at least one of the other battery cells.

21. The apparatus of claim 10, wherein the step of comparing a relative state of charge of the first battery cell with a relative state of charge of at least one of the other battery cells comprises comparing a voltage at terminals of the first battery cell with a voltage at terminals of at least one of the other battery cells.

22. The method of claim 1, wherein the step of counting the first number of times comprises:
   determining whether the first battery cell is at a lower or higher state of charge than the other battery cells;
   when the first battery cell is at a lower state of charge than the other battery cells, incrementing the first number of times; and
   when the first battery cell is at a higher state of charge than the other battery cells, not incrementing the first number of times.

23. The computer program product of claim 6, wherein the code to count the first number of times comprises code to perform the steps of:
   determining whether the first battery cell is at a lower or higher state of charge than the other battery cells;
   when the first battery cell is at a lower state of charge than the other battery cells, incrementing the first number of times; and
   when the first battery cell is at a higher state of charge than the other battery cells, not incrementing the first number of times.

24. The apparatus of claim 10, wherein the microprocessor is configured to count by performing the steps of:
   determining whether the first battery cell is at a lower or higher state of charge than the other battery cells;
   when the first battery cell is at a lower state of charge than the other battery cells, incrementing the first number of times; and
   when the first battery cell is at a higher state of charge than the other battery cells, not incrementing the first number of times.

\* \* \* \* \*